United States Patent
Wang et al.

(10) Patent No.: US 7,435,642 B2
(45) Date of Patent: Oct. 14, 2008

(54) METHOD OF EVALUATING THE UNIFORMITY OF THE THICKNESS OF THE POLYSILICON GATE LAYER

(75) Inventors: Ta-Jen Wang, Hsinchu (TW); Yuan-Chen Tsai, Hsinchu (TW); Shih-Jan Tung, Wuci Township, Taichung County (TW); Matsuo Hiroshi, Nishinomiya (JP)

(73) Assignees: Powerchip Semiconductor Corp., Hsinchu (TW); Renesas Technology Corp., Tokyo (JP)

( * ) Notice: Subject to any disclaimer, the term of this patent is extended or adjusted under 35 U.S.C. 154(b) by 148 days.

(21) Appl. No.: 11/559,410

(22) Filed: Nov. 14, 2006

(65) Prior Publication Data

US 2008/0113485 A1    May 15, 2008

(51) Int. Cl.
*H01L 21/8242* (2006.01)
(52) U.S. Cl. .............................. 438/241; 257/E21.545
(58) Field of Classification Search ............... 438/248, 438/197, 196, 221; 257/E21.545
See application file for complete search history.

(56) References Cited

U.S. PATENT DOCUMENTS

| | | | |
|---|---|---|---|
| 7,038,291 B2* | 5/2006 | Goda et al. ................. | 257/510 |
| 2006/0076611 A1* | 4/2006 | Matsui et al. ............... | 257/316 |
| 2006/0145268 A1* | 7/2006 | Kobori ....................... | 257/374 |
| 2006/0148275 A1* | 7/2006 | Han et al. ................... | 438/800 |
| 2006/0240612 A1* | 10/2006 | Lee ............................. | 438/216 |
| 2006/0258098 A1* | 11/2006 | Lee ............................. | 438/258 |
| 2007/0026633 A1* | 2/2007 | Lee ............................. | 438/424 |
| 2007/0040235 A1* | 2/2007 | Chan et al. .................. | 257/510 |

* cited by examiner

*Primary Examiner*—Thao P. Le
(74) *Attorney, Agent, or Firm*—Jianq Chyun IP Office

(57) ABSTRACT

A method of evaluating the uniformity of the thickness of the polysilicon gate layer is provided. A substrate having a dense trenches area and a sparse trenches area is provided. A plurality of first trench isolation structures are formed in the sparse trenches area of the substrate and a plurality of second trench isolation structures are simultaneously formed in the dense trenches area of the substrate. A mask layer is formed between the gaps of the first and the second trench isolation structures. A portion of the first trench isolation structures of the sparse trenches area is then removed. Then, the mask layer is removed until the surface of the substrate is exposed. A polysilicon gate layer is formed over the substrate. Finally, a planarization process is performed to remove a portion of the polysilicon gate layer.

8 Claims, 3 Drawing Sheets

METHOD OF EVALUATING THE UNIFORMITY OF THE THICKNESS OF THE POLYSILICON GATE LAYER

BACKGROUND OF THE INVENTION

1. Field of the Invention

The present invention relates to a fabricating process of semiconductor devices. In particular, the present invention relates to a method of evaluating the uniformity of the thickness of the polysilicon gate layer and preventing the problems caused by uneven thickness of the same.

2. Description of Related Art

Along with the rapid development of the integrated circuit industry and the trend of high integration, the size of the entire circuit device is forced to be minimized to meet the requirement. With the increasing demand of the minimized size of the circuit device, the requirements on the surface flatness of wafers have accordingly become more stringent. Hence, it is very important to evaluate and maintain the surface flatness of wafers during the fabricating process.

A chemical mechanical polishing (CMP) process is often used instead of the conventional dry etching process in many fabricating procedures of the integrated circuits. The chemical mechanical, polishing (CMP) process not only ensures the surface flatness of wafers but simplifies the production of the integrated circuits. Thus, the manufacturing yield can be enhanced greatly and the useable surface of wafers of the circuits is significantly increased. However, there exist some problems with the chemical mechanical polishing (CMP) process.

For example, the polysilicon chemical mechanical polishing process (poly CMP) is conventionally used in the manufacturing process of the gates of transistor or memory device. FIGS. 1A through 1C are schematic cross-sectional views showing a conventional method for fabricating the gates of memory device. First, as shown in FIG. 1A, a substrate 100 is provided. The substrate 100 has a memory cell area 102 and a peripheral circuit area 104. Next, a silicon nitride layer 106 and a patterned photoresist layer (not shown) are formed in sequence on the substrate 200. Then, a plurality of trenches 108a and 110a is formed in the substrate 100 by using the patterned photoresist layer as an etching mask, wherein the trench 108a disposed in the memory cell area 102 is more dense and the trench 110a disposed in the peripheral circuit area 104 is relatively sparse. After that, an insulating material is filled in the trenches 108a and 110a to form shallow trench isolation (STI) structures 108b and 110b. Next, as shown in FIG. 1B, the silicon nitride layer 106 and the patterned photoresist layer are removed.

Then, referring to FIG. 1C, a polysilicon layer (not shown) is formed to cover the substrate 100 and the shallow trench isolation (STI) structures 108b and 110b, wherein the polysilicon layer is used for forming gate structures. The polysilicon layer is planarized by performing polysilicon chemical mechanical polishing process and then polysilicon layers 112 and 114 are formed in the memory cell area 102 and the peripheral circuit area 104 respectively. Since the polishing rate of the polysilicon chemical mechanical polishing process is relevant to the size and density of the patterns on wafers. It is caused by the differences of partial pressures applied on the layers, meaning the different pressures caused by the same polishing force will vary on different patterned areas. Therefore, when performing the polysilicon chemical mechanical polishing process, it is easily to over polish on the surface of the wafers located in the low pattern density area (the peripheral circuit area 104) and causing the recession of the polysilicon layers in the area, which often referred as dishing effect. Subsequently, the thickness t1 of the polysilicon layer 112 and thickness t2 of the polysilicon layer 114 are not uniform and thus the entire surface of the wafer is uneven.

In specific, the poor thickness uniformity problem of the mentioned polysilicon layers will significantly affect the performance of the device. Besides, in the subsequent fabricating process, problems caused by the poor thickness uniformity of polysilicon layers will also affect the lithography process and etching process that preformed after the process of forming the gate structures. These problems will affect the reliability of the manufacturing process.

SUMMARY OF THE INVENTION

In view of the foregoing, this invention is aimed at providing a method of evaluating the uniformity of the thickness of the polysilicon gate layer and preventing the problems caused by uneven thickness of the same.

This invention provides a method of evaluating the uniformity of the thickness of the polysilicon gate layer. The method includes following steps. First, a substrate is provided and the substrate has a dense trenches area and a sparse trenches area. Next, a plurality of first trench isolation structures are formed in the dense trenches area of the substrate and simultaneously a plurality of second trench isolation structures are formed in the sparse trenches area of the substrate. A mask layer is formed between the gaps of the first trench isolation structures and the second trench isolation structures. Then, portions of the first trench isolation structures of the dense trenches area is removed to make the top surface of the first trench isolation structures lower than that of the second trench isolation structures. After that, the mask layer is removed and the surface of the substrate is exposed. Later, the polysilicon gate layer is formed to cover the substrate, the first trench isolation structures and the second trench isolation structures. Thereafter, a planarization process is performed for removing portions of the polysilicon gate layer.

According to an embodiment of the present invention, the method for removing portions of the first trench isolation structures includes the following steps. First, a photoresist layer is formed to cover the sparse trenches area of the substrate, and then the first trench isolation structures located in the dense trenches area is etched by using the photoresist layer as a mask.

According to an embodiment of the present invention, the planarization process is, for example, the polysilicon chemical mechanical polishing process.

According to an embodiment of the present invention, the material of the mask layer is, for example, silicon nitride.

According to an embodiment of the present invention, the method of forming the polysilicon gate layer is, for example, a chemical vapor deposition process.

According to an embodiment of the present invention, further including forming a pad oxide layer between the substrate and the mask layer. Furthermore, the pad oxide layer is made of, for example, silicon oxide.

According to an embodiment of the present invention, the dense trenches area and the sparse trenches area are, for example, the memory cell area and the peripheral circuit area respectively.

In the method of present invention, portions of the first trench isolation structures located in the dense trenches area is removed before the mask layer is removed to make the top surface of the first trench isolation structures lower than that of the second trench isolation structures of the sparse trenches area. Therefore, after the polysilicon chemical mechanical polishing process is performed, the thicknesses of the polysilicon gate layers located in the dense trenches area and the sparse trenches area are about even and thus preventing the conventional problem of the uneven thickness of the same.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
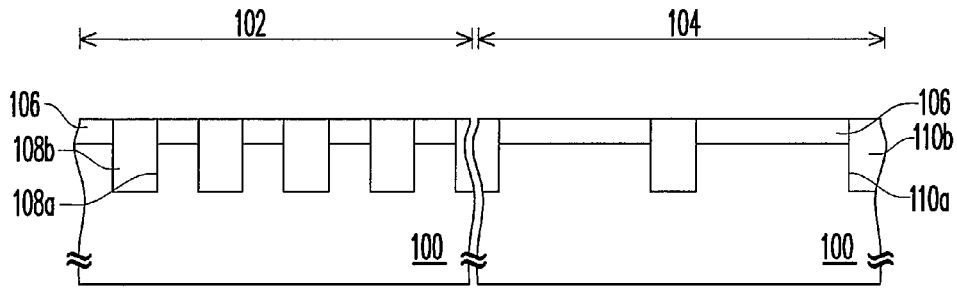
FIGS. 1A through 1C are schematic cross-sectional views showing a conventional method for fabricating the gates over the memory device.
Figure 1B:
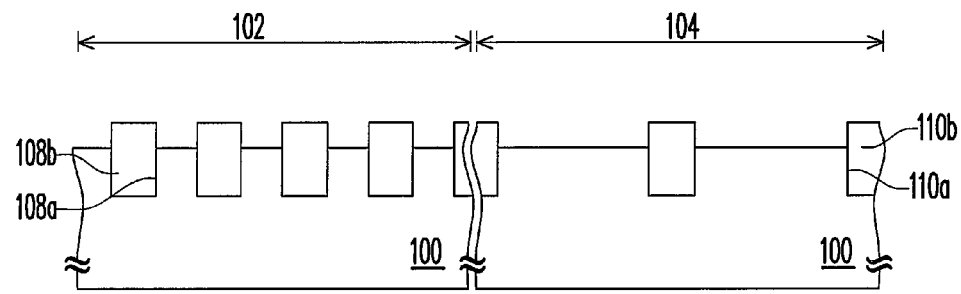
Figure 1C:
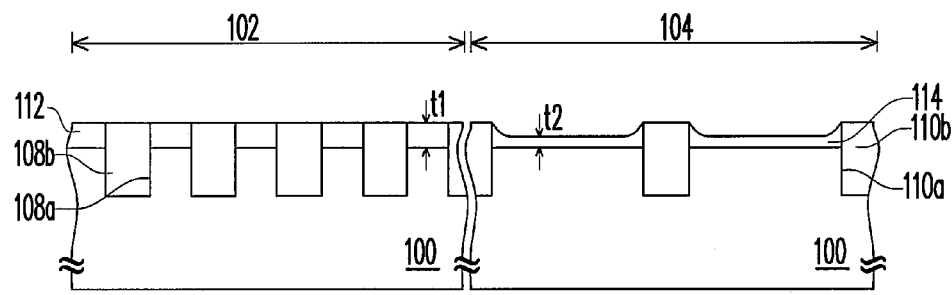

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic cross-sectional views showing the steps for the method of evaluating the uniformity of the thickness of the polysilicon gate layer according to an embodiment of the present invention.

Figure 2A:
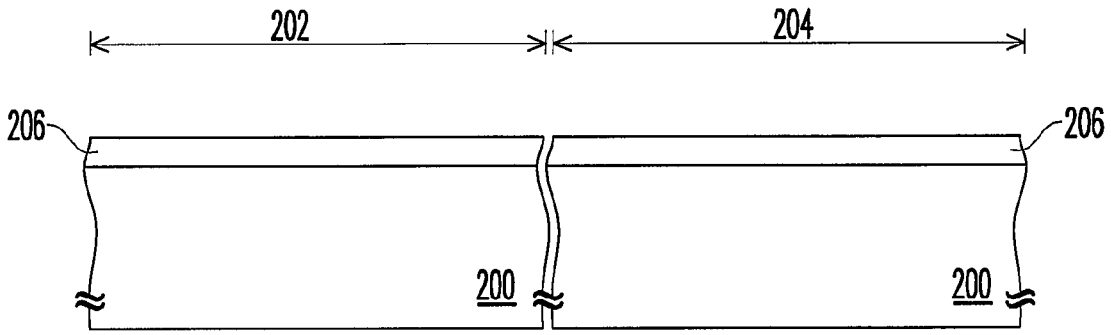
FIGS. 2A through 2F are schematic cross-sectional views showing the steps for the method of evaluating the uniformity of the thickness of the polysilicon gate layer according to an embodiment of the present invention.

As shown in FIG. 2A, a substrate 200 such as a silicon substrate is provided. The substrate 200 has a dense trenches area and a sparse trenches area, for example. According to one embodiment of the present invention, the dense trenches area is used as a memory cell area 202 and the sparse trenches area is used as a peripheral area 204, for example. However, the present invention is not limited to this. Then, a mask layer 206 is formed on the substrate 200. The material of the mask layer 206 is, for example, silicon nitride, and the method of forming the mask layer is, for example, a low pressure chemical vapor deposition (LPCVD). According to one embodiment of the present invention, for example, a pad layer (not shown) is formed between the substrate 200 and the mask layer 206. The material of the pad layer is, for example, silicon oxide and the method of forming the pad layer is, for example, a thermal oxidation.

Figure 2B:
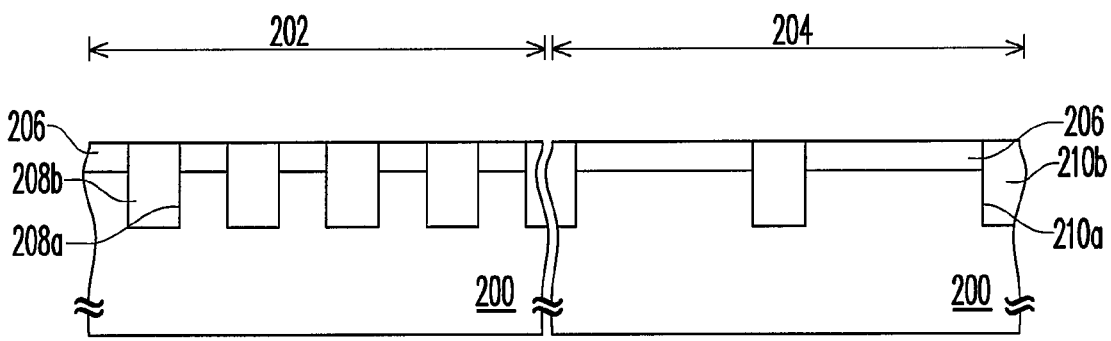

Next, referring to FIG. 2B, after the mask layer 206 is formed, a photolithography and etching process is performed to remove portions of the mask layer 206. After that, portions of the substrate 200 is etched by using the remained portion of the mask layer 206 as an etching mask to form trenches 208a in the memory cell area 202 of the substrate 200 and trenches 210a in the peripheral circuit area 204 of the substrate 200, respectively. Thereafter, an insulation material layer is formed over the substrate 200 by performing chemical vapor deposition process, for example. The insulation material layer completely fills the trenches 208a and 210a. The material of the insulation material layer is, for example, silicon oxide. Then, a chemical mechanical polishing (CMP) process is performed to remove portions of the insulation material layer by using the mask layer 206 as a polish stop layer. Then a plurality of trench isolation structures 208b is formed in the memory cell area 202 of the substrate 200, and a plurality of trench isolation structures 210b is formed in the peripheral circuit area 204 of the substrate 200 simultaneously. Wherein, the density of patterns of the trench isolation structures 208b located in the memory cell area 202 is higher than that of the trench isolation structures 210b located in the peripheral circuit area 204.

Figure 2C:
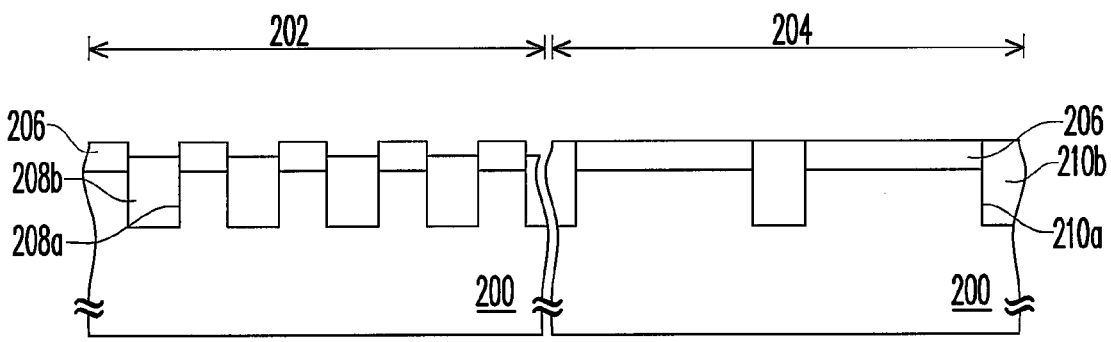

Next, referring to FIG. 2C, after the isolation trench structures 208b and 210b are formed, a photoresist layer (not shown) is formed to cover the peripheral circuit area 204 of the substrate 200. Then, portions of the trench structures 208b of the memory cell area 202 are removing by using the patterned photoresist layer as a mask. As described above, removing portions of the trench structures 208b of the memory cell area 202 results in the top surface of the trench structures 208b lower than that of the trench isolation structures 210b.

Figure 2D:
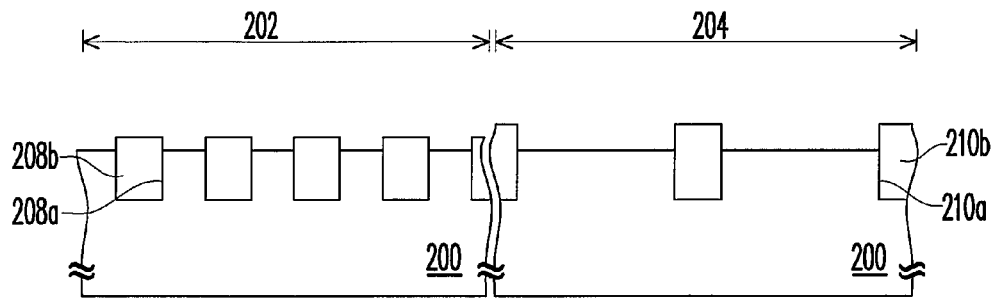

As shown in FIG. 2D, the mask layer 206 is removed and the surface of the substrate 200 is then exposed. The method of removing the mask layer 206 is, for example, performing a wet etching process.

Figure 2E:
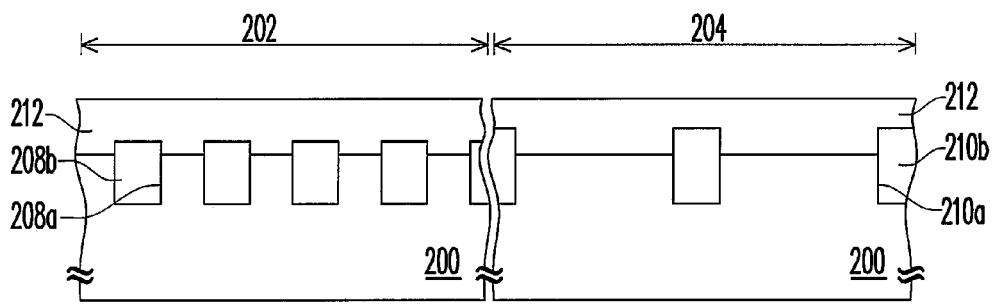

Then, referring to FIG. 2E, a polysilicon gate layer 212 is formed to cover the substrate 200 and the trench isolation structures 208b and 210b. The process for forming the polysilicon gate layer 212 is, for example, a chemical vapor deposition process.

Figure 2F:
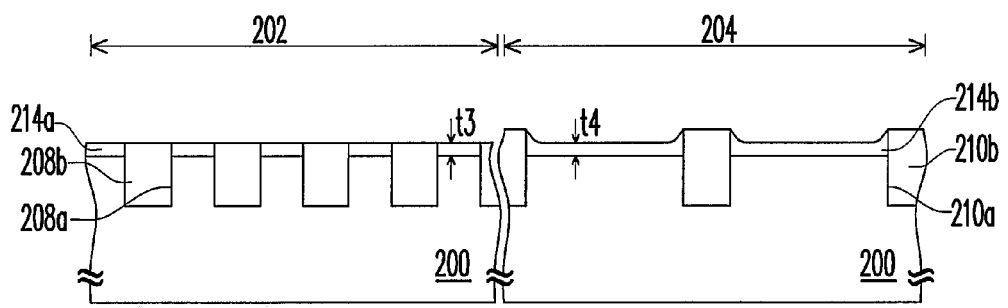

As shown in the FIG. 2F, a planarization process is performed for removing portions of the polysilicon gate layer 212 and thus to form the polysilicon gate layer 214a in the memory cell area 202 and the polysilicon gate layer 214b in the peripheral circuit area 204. As mentioned above, the planarization process is, for example, polysilicon chemical mechanical polishing (poly CMP).

It should be noted that the process described above is to remove portions of the trench isolation structure 208b of the memory cell area 202 before removing the mask layer 206 to make the top surface of the trench isolation structure 208b lower than that of the trench isolation structure 210b of the peripheral circuit area 204. Therefore, after the planarization process of the polysilicon gate layer 212 is performed, the thickness t3 of the polysilicon gate layer 214a located in the memory cell area 202 and the thickness t4 of the polysilicon gate layer 214b located in the peripheral circuit area 204 are about even that prevent the problems caused by uneven thickness of the polysilicon gate layers.

In another word, the present invention provides a method for forming a polysilicon gate layer having good thickness uniformity. Therefore, the conventional problems caused by uneven thickness, such as poor electric stability of the devices located in the dense trenches area and the sparse trenches area and poor reliability of lithography process and the etching process performed after the process of forming the gate structures, is prevented. Then the reliability of the manufacturing process is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of evaluating the uniformity of the thickness of the polysilicon gate layer, comprising:

providing a substrate having a dense trenches area and a sparse trenches area;

forming a plurality of first trench isolation structures in the dense trenches area of the substrate and simultaneously forming a plurality of second trench isolation structures in the sparse trenches area of the substrate, wherein a mask layer is formed between the gaps of the first trench isolation structures and the second trench isolation structures;

removing portions of the first trench isolation structures of the dense trenches area to make the top surface of the first trench isolation structures lower than that of the second trench isolation structures;

removing the mask layer until the surface of the substrate is exposed;

forming a polysilicon gate layer to cover the substrate, the first trench isolation structures and the second trench isolation structures; and performing a planarization process for removing portions of the polysilicon gate layer.

2. The method of claim 1, wherein the method for removing portions of the first trench isolation structures of the dense trenches area comprises:

forming a photoresist layer to cover the sparse trenches area of the substrate; and etching the first trench isolation structures located in the dense trenches area by using the photoresist layer as a mask.

3. The method of claim 1, wherein the planarization process comprises polysilicon chemical mechanical polishing process.

4. The method of claim 1, wherein the material of the mask layer comprises silicon nitride.

5. The method of claim 1, wherein the method of forming the polysilicon gate layer is a chemical vapor deposition process.

6. The method of claim 1, further comprising forming a pad oxide layer between the substrate and the mask layer.

7. The method of claim 6, wherein the material of the pad oxide layer comprises silicon oxide.

8. The method of claim 1, wherein the dense trenches area comprises a memory cell area and the sparse trenches area comprises a peripheral circuit area.

* * * * *